(12) United States Patent
Hafez et al.

(10) Patent No.: US 8,487,376 B2
(45) Date of Patent: Jul. 16, 2013

(54) HIGH-VOLTAGE TRANSISTOR ARCHITECTURES, PROCESSES OF FORMING SAME, AND SYSTEMS CONTAINING SAME

(75) Inventors: Walid M. Hafez, Portland, OR (US); Chia-Hong Jan, Portland, OR (US); Anisur Rahman, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 97 days.

(21) Appl. No.: 12/858,770

(22) Filed: Aug. 18, 2010

(65) Prior Publication Data

US 2012/0043609 A1    Feb. 23, 2012

(51) Int. Cl.
    *H01L 29/76* (2006.01)
(52) U.S. Cl.
    USPC ............... 257/337; 257/E21.59; 257/E27.06; 257/408

(58) Field of Classification Search
    USPC .............. 257/337, 408, E21.59, E27.06
    See application file for complete search history.

(56) References Cited

U.S. PATENT DOCUMENTS

| | | | | |
|---|---|---|---|---|
| 7,235,451 | B2 * | 6/2007 | Hao et al. | 438/306 |
| 2011/0215415 | A1 * | 9/2011 | Gerhardt et al. | 257/369 |

* cited by examiner

*Primary Examiner* — Long Pham
(74) *Attorney, Agent, or Firm* — Trop, Pruner & Hu, P.C.

(57) ABSTRACT

An apparatus includes a first device with a metal gate and a drain well that experiences a series resistance that drops a drain contact voltage from 10 V to 4-6 V at a junction between the drain well and a channel under the gate. The apparatus includes an interlayer dielectric layer (ILD0) disposed above and on the drain well and a salicide drain contact in the drain well. The apparatus also includes a subsequent device that is located in a region different from the first device that operates at a voltage lower than the first device.

31 Claims, 8 Drawing Sheets

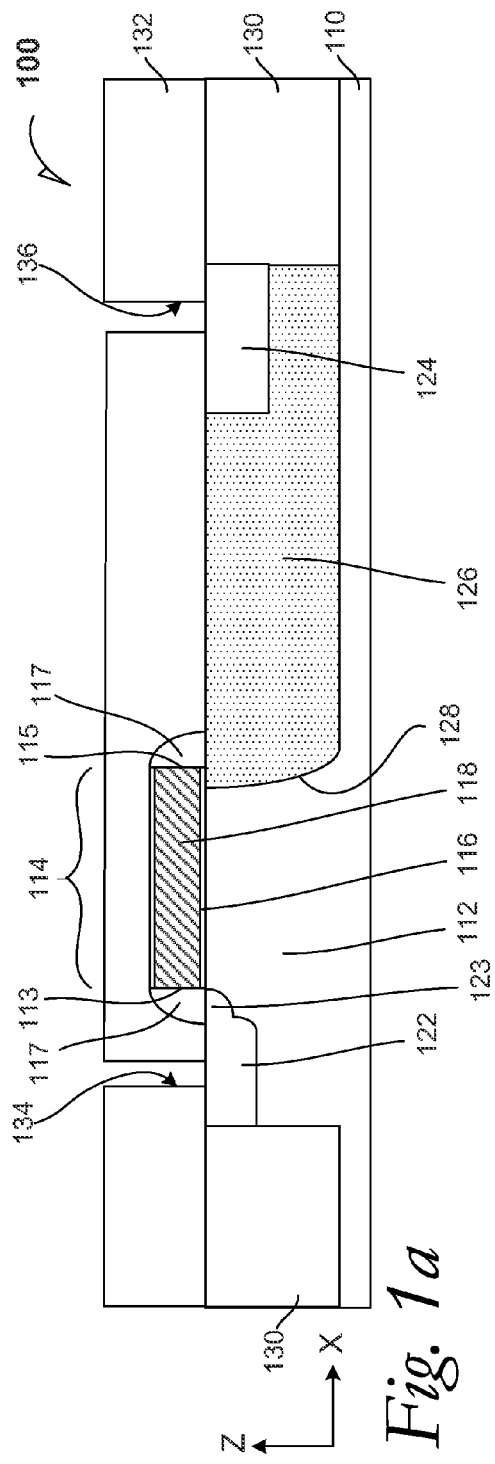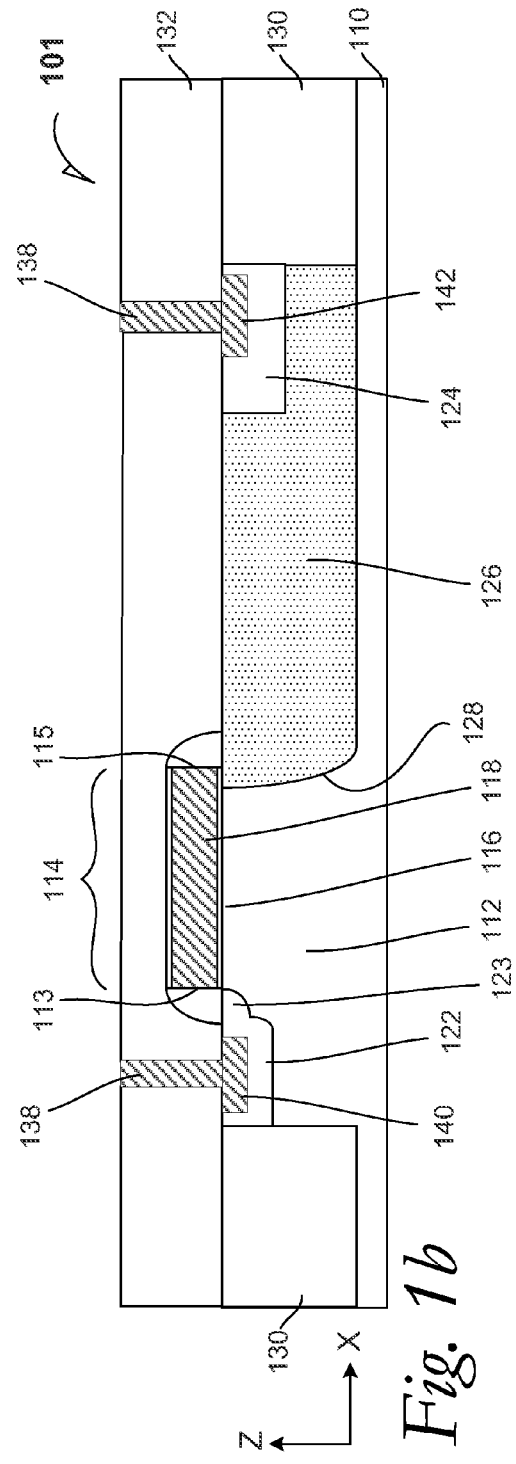

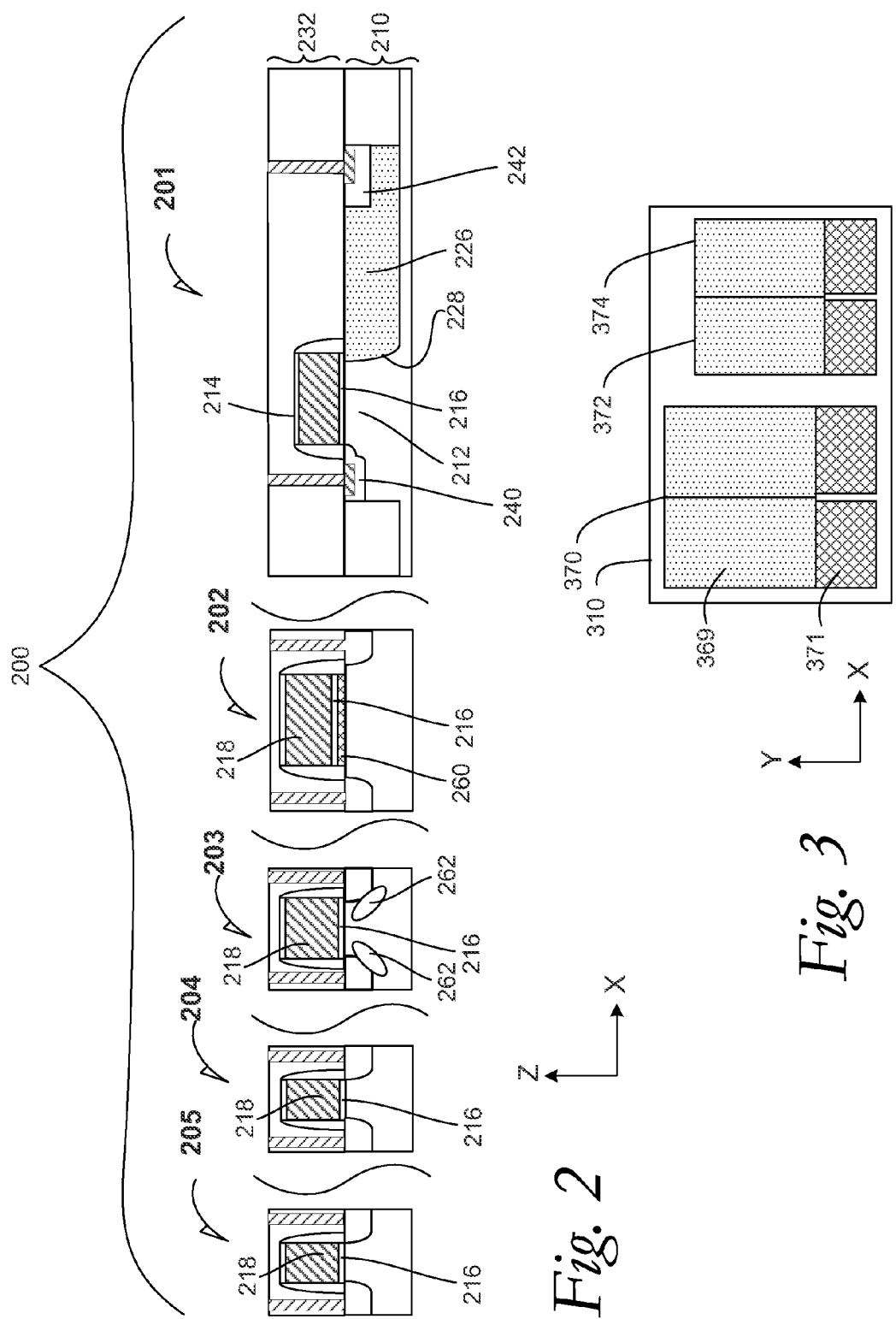

HIGH-VOLTAGE TRANSISTOR ARCHITECTURES, PROCESSES OF FORMING SAME, AND SYSTEMS CONTAINING SAME

Disclosed embodiments relate to semiconductor microelectronic devices and processes of packaging them.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which:

FIG. 1a is a cross-section elevation of a device with a metal gate and a drain extension during processing according to an example embodiment;

FIG. 1b is a cross-section elevation of the device depicted in FIG. 1a after further processing according to an embodiment;

FIG. 2 is a cross-section elevation of a system-on-chip apparatus during processing according to an embodiment;

FIG. 3 is a plan of a system-on-chip apparatus according to an embodiment;

DETAILED DESCRIPTION

Figure 1C:
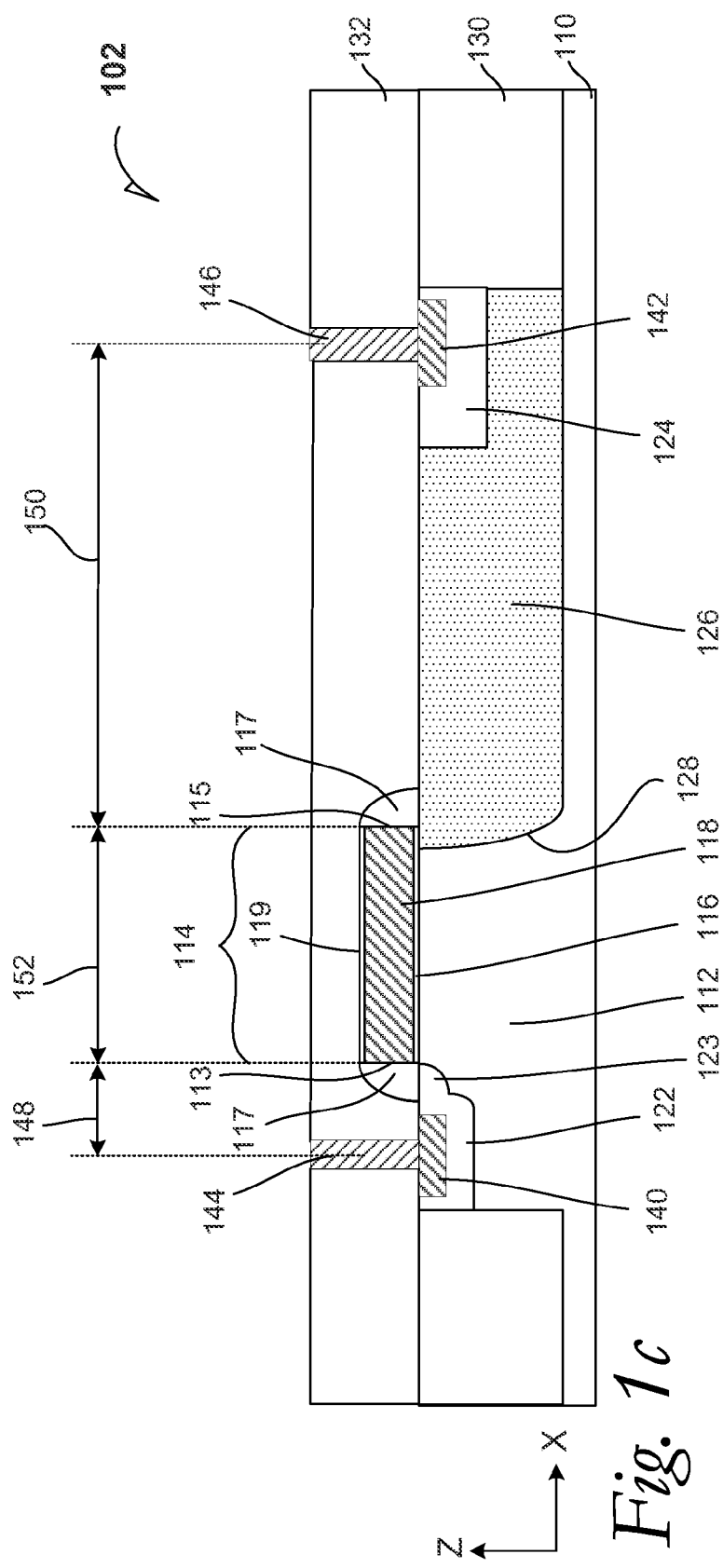
FIG. 1c is a cross-section elevation of the device depicted in FIG. 1b after further processing according to an embodiment.

Reference will now be made to the drawings wherein like structures may be provided with like suffix reference designations. In order to show the structures of various embodiments more clearly, the drawings included herein are diagrammatic representations of integrated circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings.

FIG. 1a is a cross-section elevation of a device 100 with a metal gate and a drain extension during processing according to an example embodiment. The structure illustrated may be understood to be an active device such as a semiconductive active device. A semiconductive substrate 110 supports a channel 112. In an embodiment, the semiconductive substrate 110 is a bulk semiconductive material as part of a wafer. In an embodiment, the semiconductive substrate 110 is a bulk semiconductive material as part of a chip that has been singulated from a wafer. In an embodiment, the semiconductive substrate 110 is a semiconductive material that is formed above an insulator such as a semiconductor on insulator (SOI) substrate. In an embodiment, the semiconductive substrate 110 is a prominent structure such as a fin that extends above a bulk semiconductive material.

A gate 114 is disposed above the channel 112. The gate 114 includes a first side 113 and a second side 115. In an embodiment, the gate 114 includes a high-K dielectric 116 and a high work-function metal gate electrode 118. A high work-function metal gate may be understood to be a metal that operates with conductivity higher than an N+ polysilcion gate. A high-K dielectric may be understood to be any dielectric that has a dielectric constant greater than that of silica ($SiO_2$). The device 100 also includes a source implant 122 and an implant extension 123 on a first side 113 of the gate 114, and a drain implant 124 spaced apart from a second side 115 of the gate 114. The device 100 also includes a drain well 126 in the semiconductive substrate 110 that forms a junction 128 with the channel 112. Formation of the drain well 126 and placement of the drain implant drain causes the device to be asymmetrical about the first side 113 and the second side 115. It can now be seen that resistance between the drain implant 124 and the channel 112 is greater than resistance between the source implant 240 and the channel 112. Similarly, resistivity in the combination of drain implant 124 and drain well 126 is higher than resistivity in the source implant 122.

The device 100 is isolated in a shallow-trench isolation (STI) 130 and a bottom interlayer dielectric layer (ILD0) 132 is formed over the gate 114. During processing, the ILD0 132 is formed above and on the source implant 122, the drain implant 124, and the drain well 126. A source contact via 134 and a drain contact via 136 are formed in the ILD0 132 to expose the respective source- and drain implants 122 and 124.

FIG. 1b is a cross-section elevation of the device depicted in FIG. 1a after further processing according to an embodiment. The device 101 has been processed by filling the source- and drain contact vias 134 and 136, respectively, with a saliciding material 138. Following filling the saliciding material 138, processing has been accomplished to form a self-aligned silicide (salicide) source contact pad 140 and a salicide drain contact pad 142. By processing according to this embodiment, the salicide source contact pad 140 may have a footprint that is substantially bilaterally symmetrical about the source contact via 134 in the X-dimension. Similarly, the salicide drain contact pad 142 may have a footprint that is substantially bilaterally symmetrical about the drain contact via 136.

FIG. 1c is a cross-section elevation of the device depicted in FIG. 1b after further processing according to an embodiment. The device 102 has been processed by removing the saliciding material 138 (FIG. 1b) and filling a source contact 144 to touch the salicide source contact pad 140 and filling a drain contact 146 to touch the salicide drain contact pad 142. Consequently, the ILD0 132 is also above and on the salicide source contact pad 140 and the salicide drain contact pad 142. By this processing embodiment, formation of the salicide source- and drain contact pads 140 and 142, respectively, is accomplished below the ILD0 132 and while the ILD0 132 is above and on the source implant 122, the drain implant 124, and the drain well 126.

It can be seen that by processing according to this embodiment, the salicide source contact pad 140 is symmetrical to the source contact 144 due to the saliciding process that uses the saliciding material 138 (FIG. 1b). Similarly, the salicide drain contact pad 142 is symmetrical to the drain contact 146.

Consequently, the ILD0 132 is above and on the respective salicide source contact pad 140 and the salicide drain contact pad 142.

It can be seen that the salicide drain contact 146 is spaced at a distance 150 that is farther from the second edge 115 of the gate 114 than the spacing distance 148 that the salicide source contact 144 is located from the first edge 113. The length of the drain well 126 acts in part to cause this spacing difference. The length of the drain well 126 is useful for achieving a series resistance effect such that a useful voltage drop is achievable between the salicide drain contact pad 142 and the junction 128. In an embodiment, a combination of well doping and well length are used to achieve a useful voltage drop.

In an embodiment, the gate 114 has a gate length 152 that is shorter than the distance 150 from the second side 115 to the drain contact 146. In an embodiment, the gate length 152 is equal to or smaller than the distance 150 from the second side 115 to the drain contact 146. In an embodiment, the gate length 152 is smaller than the distance 150 from the second side 115 to the drain contact 146 by a ratio of 0.85. In an embodiment, the gate length 152 is smaller than the distance 150 from the second side 115 to the drain contact 146 by a ratio of 0.7. In an embodiment, the gate length 152 is smaller than the distance 150 from the second side 115 to the drain contact 146 by a ratio of 0.65. In an embodiment, the gate length 152 is smaller than the distance 150 from the second side 115 to the drain contact 146 by a ratio of 0.5. In an embodiment, the gate length 152 is smaller than the distance 150 from the second side 115 to the drain contact 146 by a ratio of less than 0.5.

During a method of operating the device 102, a voltage drop is experienced between the drain contact 146 and the junction 128 by use of the series resistance experienced in the drain well 126. It is useful for example where an apparatus is used that employs the device 102 as a high voltage input-output (I/O) transistor such as in a radio-frequency (RF) application, for a method embodiment to experience a voltage drop from about 10 V at the drain contact 146 to a range from about 4 V to about 6 V at the junction 128.

It is understood that interconnects are formed above the source- and drain contacts 144 and 146, respectively, such as metallizations as many as eleven or more. In an embodiment, seven metallizations (M7) are formed above the source- and drain contacts 144 and 146, respectively. In an embodiment, M1-M8 are formed above the source- and drain contacts 144 and 146, respectively. In an embodiment, M1-M9 are formed above the source- and drain contacts 144 and 146, respectively. In an embodiment, M1-M10 are formed above the source- and drain contacts 144 and 146, respectively. In an embodiment, M1-M11 are formed above the source- and drain contacts 144 and 146, respectively.

In an embodiment, a PMOS process is carried out to construct the device 102. In an embodiment, an NMOS process is carried out to construct the device 102.

In an embodiment, the semiconductive substrate 110 is a p-doped material and the channel 112 is a P-well channel 112. The drain well 126 is an n-well and the source implant 122 and drain implant 124 are n-doped structures. The salicide source- and drain contact pads 140 and 142, respectively are metal silicides according to a given application need. In an example embodiment, the salicide contacts source- and drain contact pads 140 and 142, respectively are titanium silicided salicides. The gate electrode 118 is a high work-function metal that is disposed upon a high-K gate dielectric 116.

During processing, the STIs 130 are formed, followed by formation of the extended drain well and the source- and drain implants 122 and 124, respectively. Thereafter, the gate length is established by patterning the metal gate electrode 118 upon a dielectric 116. If useful for a given application, a tip implant 123 is completed, followed by the formation of spacers 117 and where needed, a cap layer 119 over the gate 114.

The ILD0 132 is formed above and on the extended drain well 126 as and above and on the respective source- and drain implant pads 122 and 124. Thereafter, a contact etch is carried out to open the respective source contact via 134 and drain contact via 136 in order to expose the respective source- and drain implant pads 122 and 124. A saliciding process is next carried out such that silicide forms substantially uniformly in the X-dimension from the center position of the saliciding material 138 as seen in FIG. 1b. As completed, the device 102 is capable of experiencing a useful voltage drop between the drain contact pad 142 and the junction 128 between the extended drain well 126 and the channel 112. In an example embodiment, the device 102 is a gate in an I/O portion of a system-on-chip (SoC) microelectronic apparatus. In an example embodiment, a voltage of about 10 V is applied at the drain contact 146 and series resistance is effectively demonstrated within the extended drain sell such that a voltage of about 4 V is experienced at the junction 128.

Figure 1D:
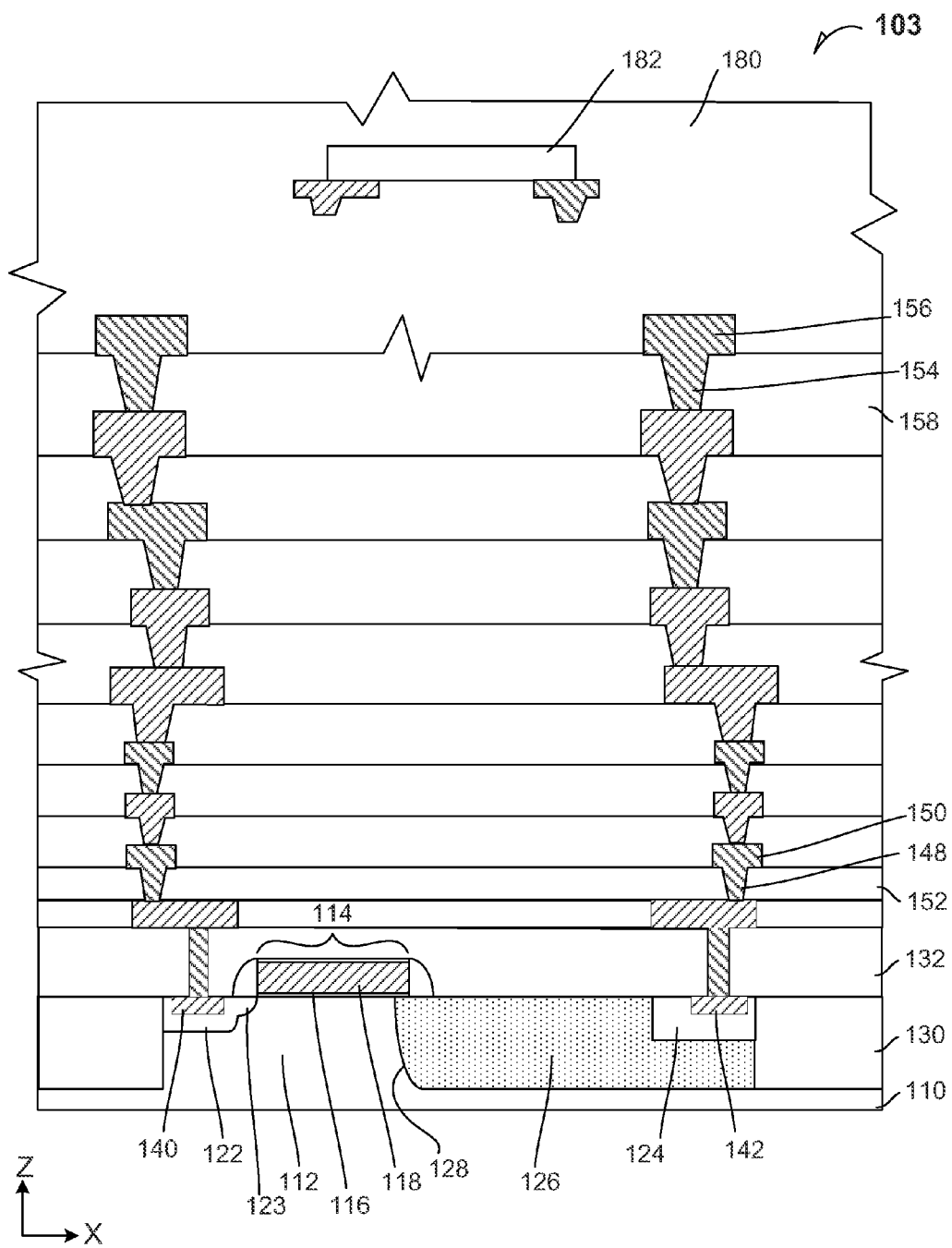
FIG. 1d is a cross-section elevation of the device depicted in FIG. 1c after further processing according to an embodiment.

FIG. 1d is a cross-section elevation of an apparatus 103 that includes the device 103 depicted in FIG. 1c after further processing according to an embodiment. The apparatus 103 has been processed by forming metallizations and other structure embodiments. After saliciding to form the salicide source- and drain contact pads 140 and 142, respectively, metallization processing may be done to couple the apparatus to other regions in the semiconductive substrate 110 as well as pinning out to the outside world where the apparatus is part of a microelectronic device such as an SoC smart telephone.

An M1 metallization includes a contact 148 including a landing pad 150 in a first ILD 152. Further processing includes seriatim formation of ILDs up to a top metallization such as an M7 with a contact 154 including a bond pad 156 in an ILD7 158 according to an embodiment. The metallization is depicted in an arbitrary configuration to illustrate pinning out of the gate 114 to the outside world. Further illustrated embodiments are now understood to include a metallization disposed above and on an ILD0 layer 132 embodiment. In an embodiment, a total between seven and 11 layers of metals are supported with tighter pitch upper metal layers to improve routing density. In an embodiment, CPU interconnects are focused on resistance-capacitance (RC) performance, such that multiple 1× and 1.5× pitch layers are used for local routing while 3× and 4× pitch layers are reserved for semi-global/global routing. In an embodiment, a 7 um thicker top metal layer 156 is used for on-die power distribution where the top metal bond pad 156 is thicker than any of the metallizations in M1 to the metallization just below the top metallization. In an embodiment during processing the ILD metallization, lower-k etch stop and CDO layers are used in interconnect stacks except for the top two layers.

In an embodiment, the metallization depicted in FIG. 1d is part of a bumpless, build-up layer (BBUL) structure that integrates the device 103. BBUL technology may be used to incorporate other devices with an SoC apparatus of which the device 103 is a part as a high-voltage RF-capable device. The device 103 may also be referred to as a gate device.

FIG. 1d also illustrates a BBUL structure 180 in simplified form with an embedded device 182 that is coupled to the gate device depicted. In an embodiment, the BBUL structure 180 encompasses the whole of the gate device as well as the metallization structure. In an embodiment, the embedded device 182 is a passive device such as a diode, a resistor, a capacitor, or an inductor that supports the gate device. In an embodiment, the embedded device 182 contains an active device such as semiconductive device that is part of a system-in-package (SiP) apparatus that includes the gate device. It should be understood the scale of the gate device and the embedded device 182 are not proportional.

FIG. 2 is a cross-section elevation of a system-on-chip apparatus 200 during processing according to an embodiment. The SoC apparatus 200 generally includes a semiconductive substrate 210 with various process and structures operated in it, and an ILD0 layer 232 similar to the device 102 depicted in FIG. 1c.

In an embodiment, the SoC apparatus 200 tracks miniaturization to guide complementary metal oxide semiconductor (CMOS) scaling to the 32 nanometer (nm) node. The SoC apparatus 200 embodiment includes integration of numerous functional circuit blocks to include high performance cores, low standby power always-on circuitry, high voltage I/O, high frequency RF, and precision analog circuits. FIG. 2 illustrates 32 nm high-K/metal gate SoC technology with a mix-and-match multiple-transistor architecture that is useful for multiple-transistor characteristics to meet the needs of different SoC circuit block embodiments. Other scaling includes larger than the 32 nm node, as well as scaling smaller than the 32 nm node depending upon specific useful embodiments.

The SoC apparatus 200 includes a high-voltage first device 201 that is depicted with substantially the same structures as the device 102 depicted in FIG. 1c. It may be understood that in an SoC use of the first device, it may be referred to as an RF-useful device 201, but this term may used merely for convenience in several embodiments.

The gate 214 sits above a high-K gate dielectric 216 and the gate 214 includes a junction 228 between an extended drain well 226 and a channel 212. In an embodiment, the first device is used in an RF-capable region of the SoC apparatus, such as for WiFi, WiMax, or Bluetooth applications.

A second device 202 is depicted as being a high-voltage I/O transistor as part of the SoC apparatus 200 that includes the high-voltage first device 201 according to an embodiment. The second device 202 may be located in a region different from that of the first device 201. The second device 202 includes an oxide first gate dielectric 260 as well as a high-K dielectric second gate dielectric 216. In an embodiment, the second gate dielectric 216 is formed during the same process flow as the gate dielectric 216 depicted in the first device 201. The second device 202 may operate at about 1.8 V, whereas the high-voltage first device 201 operates at the 10V to 4V transition between the salicide drain contact pad 242 and the junction 228. In an embodiment, the second device 202 operates at a voltage of about 3.3 V. In an embodiment, two regions of the SoC apparatus 200 include high-voltage transistors as depicted at 202, which each operate in the 1.8 V range and the 3.3 V range. In an embodiment, the second device 202 is not present with the entire SoC apparatus 200.

A third device 203 is present as an ultra low-power (ULP) transistor 203 in connection with the first device 201 with some similar structures illustrated according to an embodiment. An implant 262 such as carbon may be use to facilitate forming of the ULP device 203. The third device 203 may be located in a region different from that of the first device 201. An ULP transistor is useful for low standby/always-on circuit applications. A high-K dielectric embodiment provides a useful level of low gate leakage. In an embodiment, carbon-implant species methods and junction grading techniques are used to reduce junction leakage.

A fourth device 204 is present as a low-power (LP) logic transistor 204 in connection with the first device 201 with some similar structures illustrated according to an embodiment. The fourth device 204 may be located in a region different from that of the first device 201. In an embodiment, the LP logic transistor 204 is paired with the ULP transistor 203. The LP transistor 204 uses a 34 nm gate length and is fabricated with low damage implants and grading at the junction between the channel and each of the source- and drain implants in order to lower subthreshold leakage to a useful level A fifth device 205 is present as a high-performance (HP) logic transistor 205 in connection with the first device 201 with some similar structures illustrated according to an embodiment. The fifth device 205 may be located in a region different from that of the first device 201. In an embodiment, the HP transistor 205 is paired with the ULP transistor 203. Where an LP transistor may have a 34 nm gate length, the HP transistor 205 uses a 30 nm gate length by comparison, and the ULP transistor 403 uses a 46 nm gate length. The HP transistor 205 is fabricated with low damage implants and grading at the junction between the channel and each of the source- and drain implants in order to lower subthreshold leakage to a useful level.

It can now be seen that as many as four transistor types may be used in an SoC apparatus 200 in connection with the first device 201 including illustrated subsets. For example, the first device 201 is coupled with all of the second-third, fourth, and fifth apparatuses 202, 203, 205, and 205, respectively. In an embodiment, the first device 201 is coupled with any three of the second-third, fourth, and fifth apparatuses 202, 203, 205, and 205, respectively. In an SoC example embodiment, the first device 201 is coupled with the second 202, fourth 204, and fifth 205. In an embodiment, the first device 201 is coupled with any two of the second-third, fourth, and fifth apparatuses 202, 203, 205, and 205, respectively. In an embodiment, the first device 201 is coupled with any one of the second-third, fourth, and fifth apparatuses 202, 203, 205, and 205, respectively.

FIG. 3 is a plan 300 of an SoC device according to an embodiment. A semiconductive substrate 310 supports a dual-core processor 370, a graphics processor 372, and a radio frequency (RF) processor 374 according to an embodiment. Although the dual-core processor 370 is shown to have a larger footprint than those of the graphics- and RF processors 372 and 374, respectively, this illustration may be arbitrary depending upon the specific useful application of an SoC layout. In an embodiment, the dual-core processor 370 includes a processor field 369 and a memory field 371. For example, the memory field 371 may be a static random-access memory (SRAM) field 371 that utilizes ULP transistor embodiments.

It may now be understood that the SoC apparatus 300 may be a device such as a smart telephone that includes useful telephonic capabilities of a cell phone, as well as useful graphics and RF-processing capabilities of an internet browser by way of non-limiting example embodiments. The first device 201 (FIG. 2) may be useful in an RF processor 374 where a significant voltage drop is used such as about 10V at the salicide drain contact 342, followed by a series resistance through the extended drain well 326 that is experienced to be about 4V at the junction 328 between the extended drain well 326 and the channel 312. Other gate apparatus embodiments may be fabricated onto the semiconductive substrate 310 according to useful combinations for an SoC apparatus 300.

Supporting passive devices for the SoC apparatus 300 may include resistors such as well resistors, trench contact linear resistors, and precision linear resistors that are capable of less than a 0.5 percent matching and a lowered temperature coefficient of resistance (TCR). Where the upper metallization has a low resistivity, such as an M7 if at the top or an M11 if at the top, increased Q inductors with a quality factor of 20 may be employed in the SoC apparatus 300.

Other supporting passive devices may include capacitors supported include metal-insulator semiconductor (MIS) and metal-oxide-metal (MOM) metal finger capacitors with Q in excess of 100 to be used for RF frequency applications of the SoC apparatus 300. Other supporting devices that are useful in the SoC apparatus 300 include include varactors, vertical BJTs, bandgap diodes, and high density secure fuses such as one-time programmable (OTP) memory.

Figure 4:
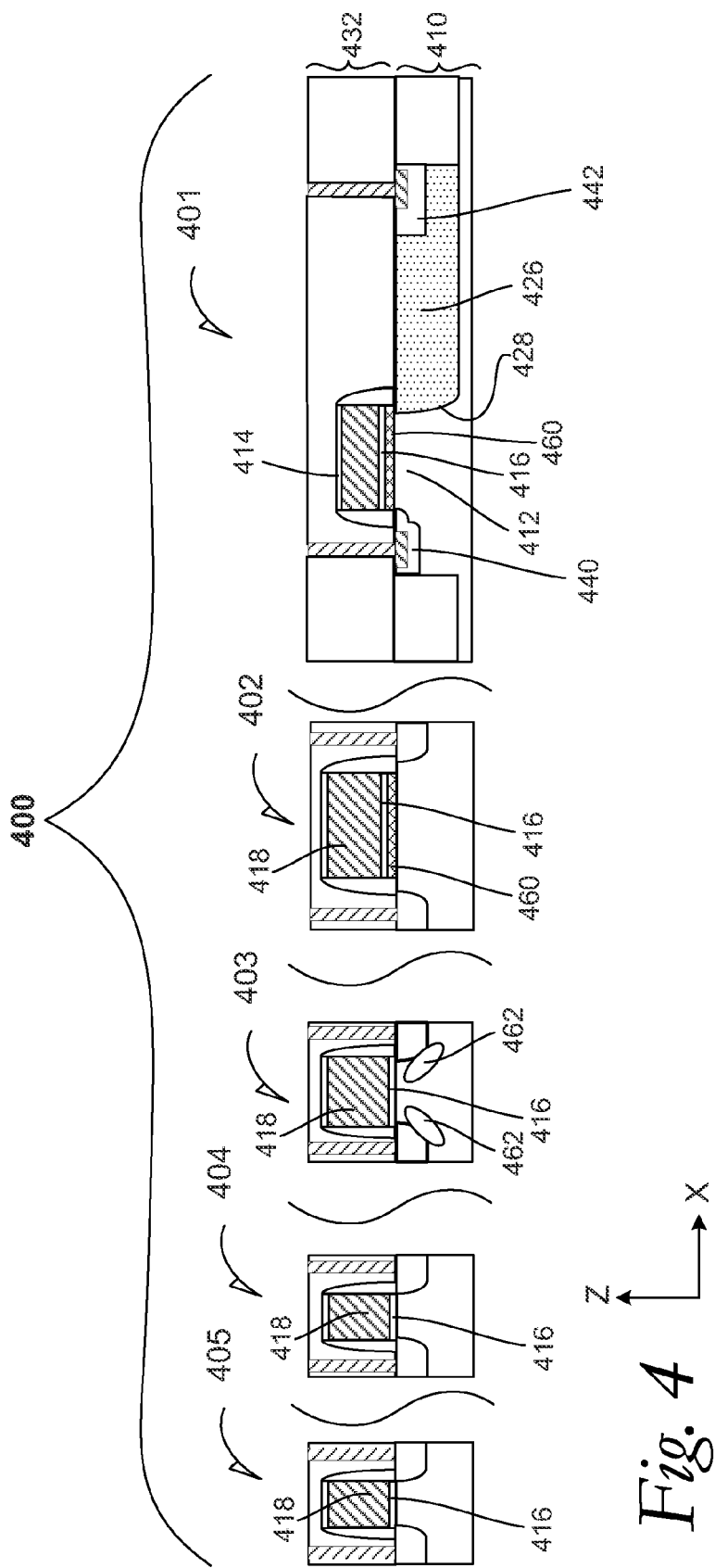
FIG. 4 is a cross-section elevation of a system-on-chip apparatus during processing according to an embodiment.

FIG. 4 is a cross-section elevation of a system-on-chip apparatus 400 during processing according to an embodiment. The SoC apparatus 400 generally includes a semiconductive substrate 410 with various process and structures operated in it, and an ILD0 layer 432 similar to the apparatus 102 depicted in FIG. 1c.

In an embodiment, the SoC apparatus 400 tracks miniaturization to guide CMOS scaling to the 32 nm node. The SoC apparatus 400 embodiment includes integration of numerous functional circuit blocks to include high performance cores, low standby power always-on circuitry, high voltage I/O, high frequency RF, and precision analog circuits. FIG. 4 illustrates 32 nm high-K/metal gate SoC technology with a mix-and-match multiple-transistor architecture that is useful for multiple-transistor characteristics to meet the needs of different SoC circuit block embodiments. Other scaling includes larger than the 32 nm node, as well as scaling smaller than the 32 nm node depending upon specific useful embodiments.

The SoC apparatus 400 includes a high-voltage first device 401 that is depicted with substantially the same structures as the device 102 depicted in FIG. 1c and additionally with an oxide first gate dielectric 460 as well as a high-K dielectric second gate dielectric 416. The gate 414 sits above a high-K gate dielectric 416 and the gate 414 includes a junction 428 between an extended drain well 426 and a channel 412.

A second device 402 is depicted as being a high-voltage I/O transistor as part of the SoC apparatus 400 that includes the high-voltage first device 401 according to an embodiment. The second device 402 may be located in a region different from that of the first apparatus 401. The second device 402 includes an oxide first gate dielectric 460 as well as a high-K dielectric second gate dielectric 416. In an embodiment, the second gate dielectric 416 is formed during the same process flow as the gate dielectric 416 depicted in the first device 401. The second device 402 operates at about 1.8 V, whereas the high-voltage first device 201 operates at a range from 12V to a 4V transition between the salicide drain contact 442 and the junction 428. In an embodiment, the second device 402 operates at a voltage of about 3.3 V. In an embodiment, two regions of the SoC apparatus 400 include high-voltage transistors as depicted at 402, which each operate in the 1.8 V range and the 3.3 V range. In an embodiment, the second device 402 is not present with the entire SoC apparatus 400.

A third device 403 is present as an ULP transistor 403 in connection with the first device 401 with some similar structures illustrated according to an embodiment. The third device 403 may be located in a region different from that of the first device 401. In an embodiment, cobalt-implant species methods and junction grading techniques are used to reduce junction leakage. In an embodiment, cobalt doping 462 is carried out at the junctions between source- and drain implants and the channel.

A fourth device 404 is present as an LP logic transistor 404 in connection with the first device 401 with some similar structures illustrated according to an embodiment. The fourth device 404 may be located in a region different from that of the first device 401. In an embodiment, the LP logic transistor 404 is paired with the ULP transistor 403. The LP transistor 404 uses a 34 nm gate length and is fabricated with low damage implants and grading at the junction between the channel and each of the source- and drain implants in order to lower subthreshold leakage to a useful level according to an embodiment. A fifth device 405 is present as an HP logic transistor 405 in connection with the first device 401 with some similar structures illustrated according to an embodiment. The fifth device 405 may be located in a region different from that of the first device 401. In an embodiment, the HP transistor 405 is paired with the ULP transistor 403. Where the LP transistor may have a 34 nm gate length, the HP transistor 405 uses a 30 nm gate length by comparison, and the ULP transistor 403 uses a 46 nm gate length. The HP transistor 405 is fabricated with low damage implants and grading at the junction between the channel and each of the source- and drain implants in order to lower subthreshold leakage to a useful level. It can now be seen that as many as four transistor types may be used in an SoC apparatus in connection with the first device 401 including illustrated subsets. For example, the first device 401 is coupled with all of the second-third, fourth, and fifth devices 402, 403, 405, and 405, respectively. In an embodiment, the first device 401 is coupled with any three of the second-third, fourth, and fifth devices 402, 403, 405, and 405, respectively. In an SoC apparatus example embodiment, the first device 401 is coupled with the second 402, fourth 404, and fifth 405. In an embodiment, the first device 401 is coupled with any two of the second-third, fourth, and fifth devices 402, 403, 405, and 405, respectively. In an embodiment, the first device 401 is coupled with any one of the second-third, fourth, and fifth devices 402, 403, 405, and 405, respectively.

It may now be understood that an SoC apparatus may be constructed that combines both the first device 201 depicted in FIG. 2 with the first device 401 depicted in FIG. 4 to be part of an SoC apparatus embodiment. By the same token, any of the HP, LP, ULP devices depicted in FIGS. 2 and 4 may be combined as needed with the first device 201 depicted in FIG. 2 with the first device 401 depicted in FIG. 4 to be part of an SoC embodiment.

It may now be appreciated by review of the embodiments discussed and illustrated in FIGS. 1c, 2, 3, and 4, that methods of operating an apparatus may include a single semiconductive chip with a first region that operates at a first voltage, and any number of subsequent regions that operate a subsequent voltages that are less than the first voltage. The "subsequent region(s)" are referred to herein as a second region, a third region, a fourth region, and a fifth region. In a method embodiment, the method of operating an SoC apparatus includes operating the first region at a first voltage, a second region that operates at a second voltage less than the first voltage, a third region that operates at a voltage less than the first and second voltages, and a fourth region that operates at a fourth voltage less than the first- second- and third voltages. In an example embodiment, a first region 201 operates at a first voltage of about 4-6 V, a second region 202 operates a second voltage of about 1.8 to 3.3 V, a third region 203 operates at a third voltage of about 1 to 1.2V, and a fourth region (204 or 205) operates at a voltage of about 0.75V. It can be seen from FIG. 2 that essentially four voltages may be used to operate the apparatus 200, but the second region 202 may operate at 1.8 V or 3.3 V depending upon a given application, and the fourth region (204 and 205) may each operate at the 0.75V potential, but one may operate in LP mode and the other in HP mode.

Figure 5:
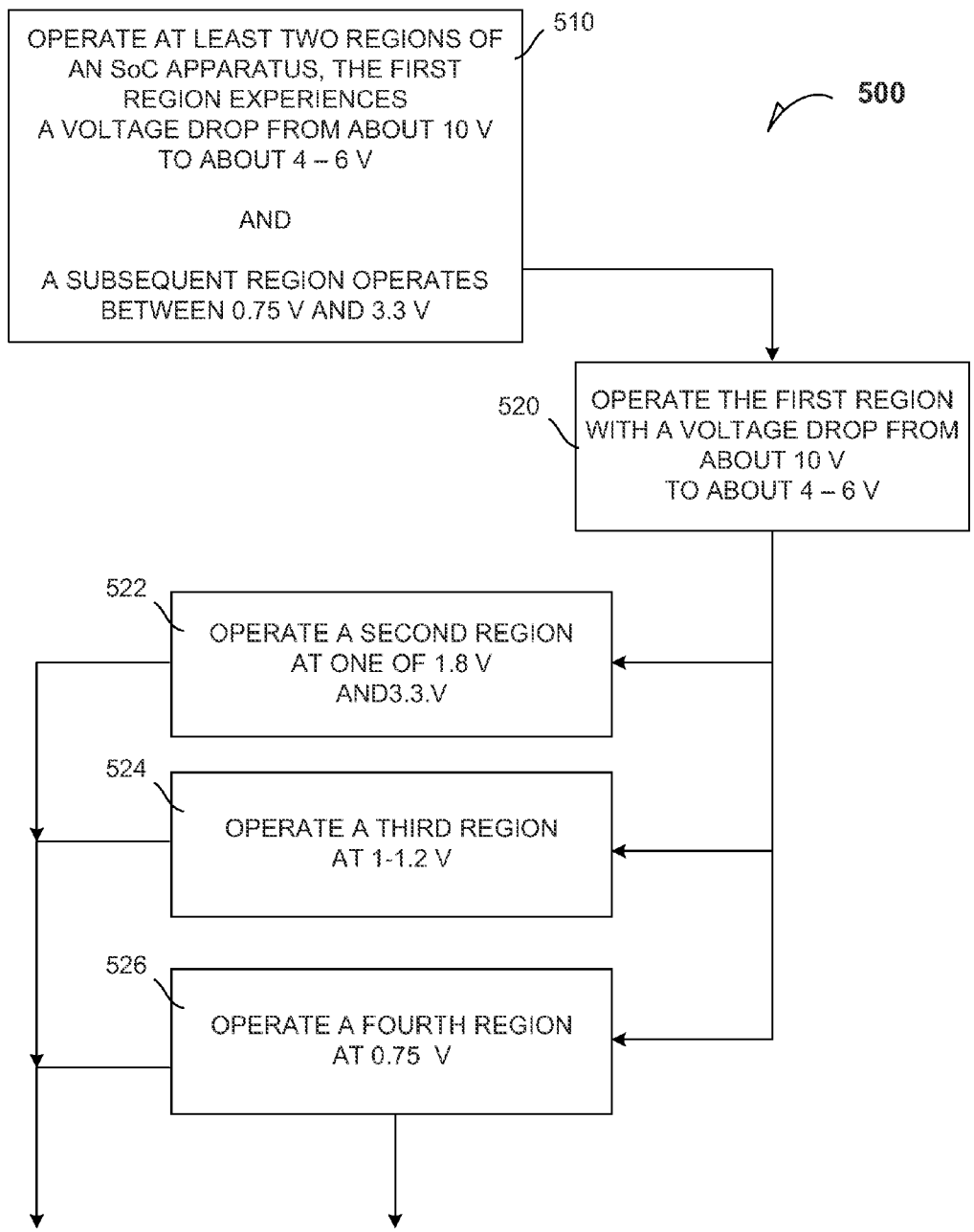
FIG. 5 is a method flow diagram according to an example embodiment.

FIG. 5 is a method flow diagram 500 according to an example embodiment. The method includes operating an SoC apparatus chip with a first region that operates at a first voltage, a second region that operates at a second voltage less than the first voltage, a third region that operates at a voltage less than the first and second voltages, and a fourth region that operates at a fourth voltage less than the first- second- and third voltages.

At 510, the method includes operating at least two regions of an SoC apparatus, the first region is operated to experience a voltage drop from about 10 V to a range of about 4-6 V. The method includes operating a subsequent region of the SoC apparatus at a voltage between about 0.75 V and 3.3 V.

At 520 the method includes operating the first region to experience a voltage drop from about 10 V to a range of about 4-6 V.

At 522, the method at 520 includes operating a subsequent region enumerated as a second region to experience a voltage at one of 1.8 V and 3.3. V. In a non-limiting example embodiment, the method includes RF activity in the first region and high-voltage I/O activity in the second region.

At 524, the method at 520 includes operating a subsequent region enumerated as a third region to experience a voltage at 1-1.2 V. In a non-limiting example embodiment, the method includes RF activity in the first region and ULP activity in the third region.

At 526, the method at 520 includes operating a subsequent region enumerated as a fourth region to experience a voltage at 0.75. In a non-limiting example embodiment, the method includes RF activity in the first region and LP-logic activity in the fourth region. In a non-limiting example embodiment, the method includes RF activity in the first region and HP-logic activity in the fourth region. In a non-limiting example embodiment, the method includes RF activity in the first region and each of HP-logic activity in a subsequent region and LP-logic activity in a subsequent region.

Figure 6:
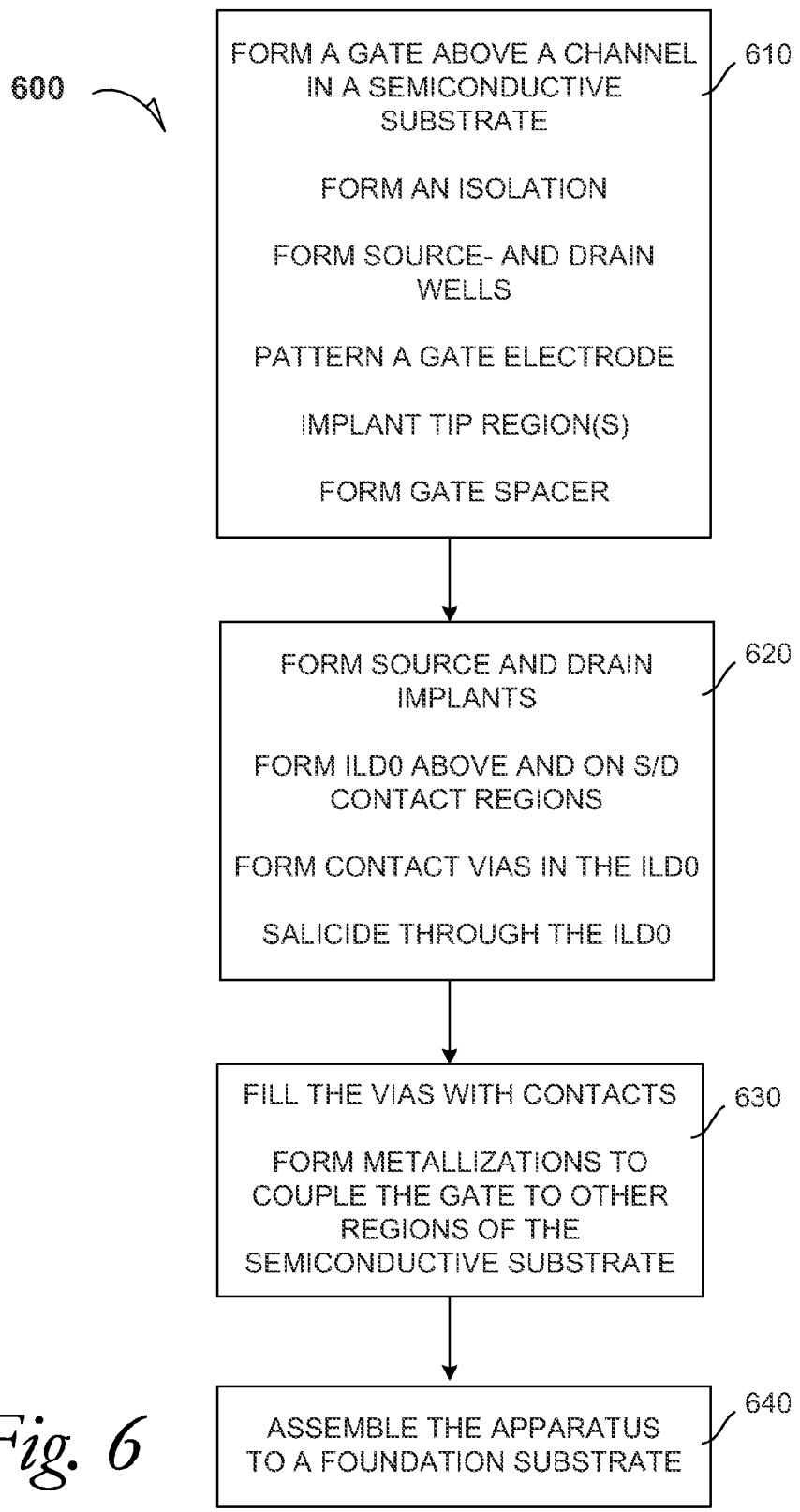
FIG. 6 is a process flow diagram according to an example embodiment.

FIG. 6 is a process flow diagram 600 according to an example embodiment.

At 610, the process includes forming a gate upon a semiconductive substrate above a channel. Details of gate forming including forming an isolation such at the STI 130. Source- and drain wells may be formed in connection with the isolation, such as patterning of all wells may first be done, followed by patterning the STI 130. Thereafter, a gate electrode is patterned above the channel. The drain well is formed with an extended geometry compared to relative placement of the source well as seen in FIG. 1a according to an embodiment. It may be understood that doping the drain well may also be used to make an effective extended-length drain well.

A non-limiting example embodiment includes forming the metal gate electrode 114 above a high-K dielectric 116 as illustrated in FIG. 1a. Tip regions may be implanted such as the tip region 123. Thereafter, formation of gate spacers may be accomplished such as the gate spacers 117.

At 620, the process includes forming salicided source- and drain contact pads. The process includes forming source- and drain implants such as the source implant 122 and the drain implant 124. The process also includes forming an ILD0 above and on the source- and drain implants, followed by forming a source contact via 134 and a drain contact via 136 in the ILD0. Next, the process includes saliciding source- and drain contact pads through the ILD0. In a non-limiting example embodiment, the source contact pad 140 and the drain contact pad 142 are formed with a saliciding material 138.

At 630, the process includes filling the vias with contacts. This process embodiment includes examples such as filling the source- and drain contacts 144 and 146, respectively to make contact with the source- and drain contact pads 140 and 142, respectively. This process embodiment also includes forming metallizations such as M1 up to M7 or higher or up to M11 or higher, to couple the gate to other regions of the semiconductive substrate. This process also includes connecting the device to other devices in the SoC embodiment, as well as connecting the device to the outside world.

At 640, the process includes assembling the apparatus to a foundation substrate. A "foundation substrate" may mean assembling the SoC apparatus to a board as the foundation substrate. The foundation substrate may mean assembling the SoC apparatus to a BBUL substrate that carries the SoC and supporting structures and devices such as power sources, user I/O interfaces, audio devices, passive devices, and others.

Figure 7:
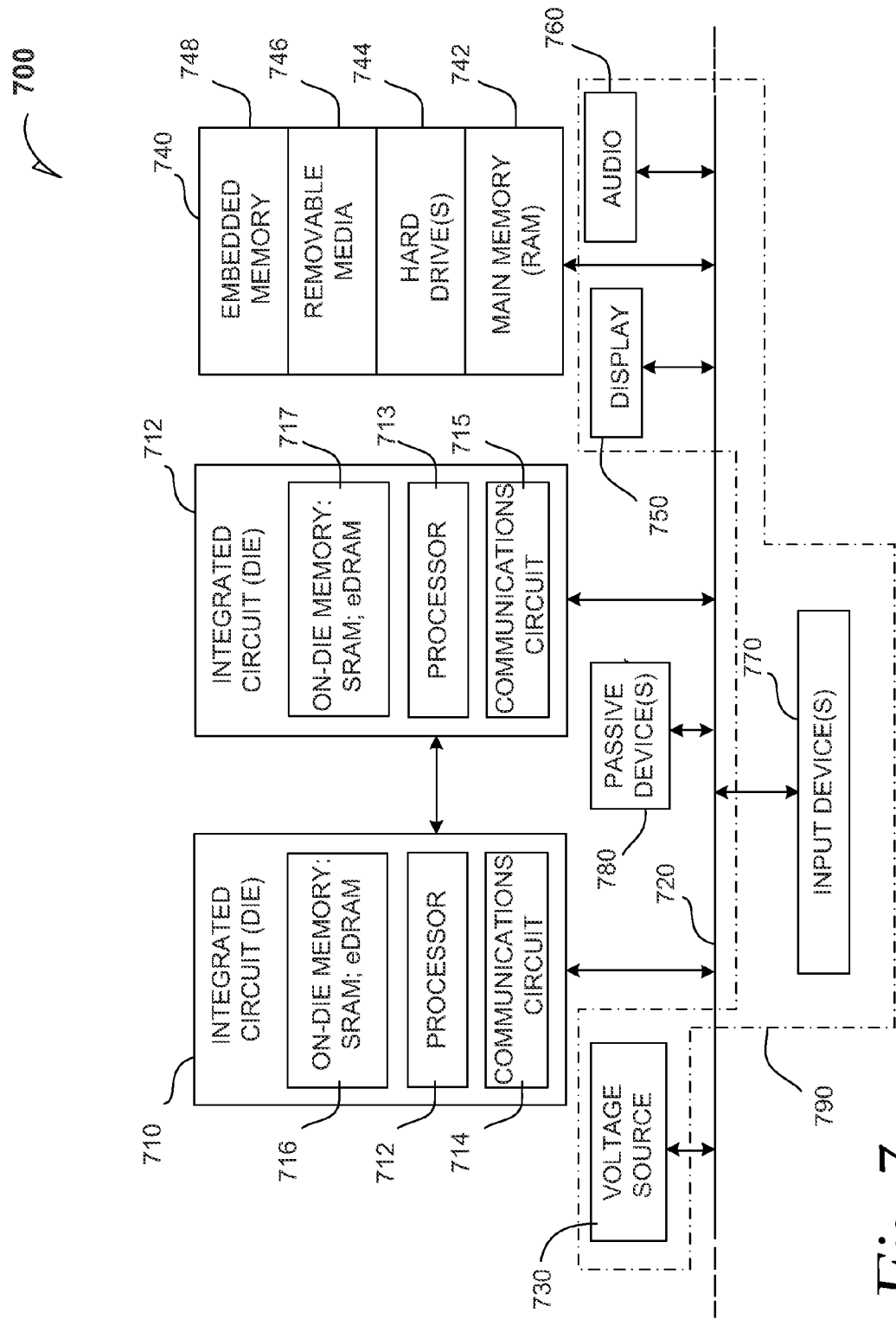
FIG. 7 is a schematic of a computer system according to an embodiment.

FIG. 7 is a schematic of a computer system 700 according to an embodiment. The computer system 700 as depicted can embody an extended drain RF-capable region of an SoC apparatus that includes at least one subsequent region that operates at a lower voltage than the 4-6 V range of the RF-capable region according to any of the several disclosed embodiments and their equivalents as set forth in this disclosure. The computer system 700 may be a mobile device such as a netbook computer. The computer system 700 may be a mobile device such as a wireless smart phone. The computer system 700 may be a handheld device. The computer system may be a mobile device such as a smart phone that includes automotive-support capabilities such as a global-positioning system (GPS), as well as a wireless internet transceiver.

In an embodiment, the electronic system 700 is a computer system that includes a system bus 720 to electrically couple the various components of the electronic system 700. The system bus 720 is a single bus or any combination of busses according to various embodiments. The electronic system 700 includes a voltage source 730 that provides power to the integrated circuit 710. In some embodiments, the voltage source 730 supplies current to the integrated circuit 710 through the system bus 720.

The integrated circuit 710 is electrically coupled to the system bus 720 and includes any circuit, or combination of circuits according to an embodiment. In an embodiment, the integrated circuit 710 includes a processor 712 that can be of any type. As used herein, the processor 712 may mean any type of circuit such as, but not limited to, a microprocessor, a microcontroller, a graphics processor, a digital signal processor, or another processor. In an embodiment, the processor 712 is the embedded die disclosed herein. In an embodiment, SRAM embodiments are found in memory caches of the processor. Other types of circuits that can be included in the integrated circuit 710 are a custom circuit or an application-specific integrated circuit (ASIC), such as a communications circuit 714 for use in wireless devices such as cellular telephones, smart phones, pagers, portable computers, two-way radios, and similar electronic systems. In an embodiment, the processor 710 includes on-die memory 716 such as SRAM. In an embodiment, the processor 710 includes embedded on-die memory 716 such as embedded dynamic random-access memory (eDRAM).

In an embodiment, the integrated circuit 710 is complemented with a subsequent integrated circuit 711 such as an apparatus that is coupled with an extended drain RF-capable region of an SoC apparatus. In this embodiment, a dual-core apparatus may be used as depicted in FIG. 3.

In an embodiment, the electronic system 700 also includes an external memory 740 that in turn may include one or more memory elements suitable to the particular application, such as a main memory 742 in the form of RAM, one or more hard drives 744 such as a solid-state drive (SSD), and/or one or more drives that handle removable media 746, such as diskettes, compact disks (CDs), digital variable disks (DVDs), flash memory drives, and other removable media known in the art. The external memory 740 may also be embedded memory 748 such as contained in a BBUL integrated package that includes an SoC apparatus with an extended drain RF-capable region of an SoC apparatus according to an embodiment.

In an embodiment, the electronic system 700 also includes a display device 750, an audio output 760. In an embodiment, the electronic system 700 includes an input device such as a controller 770 that may be a keyboard, mouse, trackball, game controller, microphone, voice-recognition device, or any other input device that inputs information into the electronic system 700. In an embodiment, an input device 770 is a camera. In an embodiment, an input device 770 is a digital sound recorder. In an embodiment, an input device 770 is a camera and a digital sound recorder. In an embodiment, a passive device 780 such as a resistor, a diode, an inductor, and a capacitor is integrated into the computing system 700. The passive device 780 is depicted generically coupled to the system bus 720, but it may be closely associated with circuitry that includes a RF-capable region of an SoC apparatus embodiment.

A foundation substrate 790 may be part of the computing system 700. In an embodiment, the foundation substrate 790 is a BBUL structure that integrates the SoC apparatus embodiment(s). In an embodiment, the foundation substrate 790 is a BBUL structure that integrates the SoC apparatus embodiment(s) along with at least one BBUL embedded device that supports the SoC apparatus in an SiP embodiment. In an embodiment, the foundation substrate 790 is a board onto which the SoC embodiment is mounted. In an embodiment, the foundation substrate 790 incorporates at least one of the functionalities encompassed within the dashed line 790 and is a substrate such as the user shell of a wireless communicator.

As shown herein, the integrated circuit 710 can be implemented in a number of different embodiments, including an extended drain RF-capable region of an SoC apparatus according to any of the several disclosed embodiments and their equivalents, an electronic system, a computer system, one or more methods of fabricating an integrated circuit, and one or more methods of fabricating an electronic assembly that includes an extended drain RF-capable region of an SoC apparatus according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed extended drain RF-capable region of an SoC apparatus embodiments and their equivalents.

Although an SoC apparatus may refer to a processor chip, an RF chip or a memory chip may be mentioned in the same sentence, but it should not be construed that they are equivalent structures. Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Terms such as "upper" and "lower" "above" and "below" may be understood by reference to the illustrated X-Z coordinates, and terms such as "adjacent" may be understood by reference to X-Y coordinates or to non-Z coordinates.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A device, comprising:
a channel in a semiconductive substrate;
a gate electrode disposed above the channel;
a source implant on a first side of the gate electrode and a drain implant on a second side of the gate electrode;
a drain well in the semiconductive substrate that forms a junction with the channel;
a salicide source contact pad in the semiconductive substrate;
a salicide drain contact pad in the drain well, wherein the salicide drain contact pad is located farther from the second side than the source contact pad is located from the first side; and
an interlayer dielectric layer (ILD0) disposed above and on the salicide drain contact pad and the drain well.

2. The device of claim 1, wherein resistance between the drain implant the channel is greater than resistance between the source implant and the channel.

3. The device of claim 1, wherein resistivity between the drain implant and the channel is greater than resistivity between the source implant and the channel.

4. The device of claim 1, wherein the gate electrode is a high-K metal gate electrode, the device further including an oxide dielectric disposed on the channel, and wherein a high-K dielectric is disposed between the oxide dielectric and the gate electrode.

5. The device of claim 1, further including a source contact that penetrates the ILD0.

6. The device of claim 1, further including:
a source contact that penetrates the ILD0 and that contacts the salicide source contact pad; and a drain contact that penetrates the ILD0 and that contacts the salicide drain contact pad, and wherein the ILD0 also is disposed above and on the salicide source contact pad.

7. The device of claim 1, wherein the gate electrode is part of a gate, further including:
   a source contact that penetrates the ILD0 and that contacts the salicide source contact pad; and
   a drain contact that penetrates the ILD0 and that contacts the salicide drain contact pad, and wherein the ILD0 also is disposed above and on the gate.

8. The device of claim 1, wherein the gate electrode is part of a gate, further including:
   a source contact that penetrates the ILD0 and that contacts the salicide source contact pad; and
   a drain contact that penetrates the ILD0 and that contacts the salicide drain contact pad, and wherein the ILD0 also is disposed above and on the salicide source contact pad and above and on the gate.

9. The apparatus of claim 1, further including integral to the substrate:
   at least one of:
      a first logic transistor that operates at about 0.75-1 Volt (V) and 100 nano Ampere/micrometer (nA/µm);
      a second logic transistor that operates at about 0.75-1 Volt V and 1 nA/µm;
      an ultra low-power transistor that operates about 0.75-1.2 V and 0.03 nA/µm;
   at least one of:
      a first high-voltage transistor that operates at about 1.5-1.8 V and 0.1 nA/µm; and
      a second high-voltage transistor that operates at about 1.5-3.3 V and 10 pico A/µm or less; and
   wherein the drain well exhibits a series resistance from the salicide drain contact to the junction from about 10 V to about 4 V.

10. The device of claim 1, wherein the device is a first device in a first region of the semiconductive substrate, further including:
   a subsequent device in a region separate from the first device, wherein the first device is configured to operate at a voltage higher than the subsequent device and the first device and the subsequent device form an apparatus; and
   metallization layers above and coupled to the first device and the subsequent device.

11. The device of claim 1, wherein the device is a first device in a first region of the semiconductive substrate, further including:
   a second device in a second region separate from the first device, wherein the first device is configured to operate at a voltage higher than the second device;
   a third device in a third region separate from the first device and from the second device, wherein the first device is configured to operate at a voltage higher than the second device, and wherein the third device is configured to operate at a voltage lower than the second device; and
   metallization layers above and coupled to the first device.

12. The device of claim 1, wherein the device is a first device in a first region of the semiconductive substrate, further including:
   a second device in a second region separate from the first device, wherein the first device is configured to operate at a voltage higher than the second device;
   a third device in a third region separate from the first device and from the second device, wherein the first device is configured to operate at a voltage higher than the second device, and wherein the third device is configured to operate at a voltage lower than the second device;
   a fourth device in a fourth region separate from the first device, from the second device, and from the third device, wherein the first device is configured to operate at a voltage higher than the second device, and wherein the third device is configured to operate at a voltage lower than the second device, wherein the fourth device is configured to operate a voltage lower than the third device; and
   metallization layers above and coupled to the first device.

13. The device of claim 1, wherein the device is a first device in a first region of the semiconductive substrate, further including:
   a second device in a second region separate from the first device, wherein the first device is configured to operate at a voltage higher than the second device;
   a third device in a third region separate from the first device and from the second device, wherein the first device is configured to operate at a voltage higher than the second device, and wherein the third device is configured to operate at a voltage lower than the second device;
   a fourth device in a fourth region separate from the first device, from the second device, and from the third device, wherein the first device is configured to operate at a voltage higher than the second device, and wherein the third device is configured to operate at a voltage lower than the second device, wherein the fourth device is configured to operate a voltage lower than the third device;
   a fifth device in a fifth region separate from the first device, from the second device, from the third device, and from the fourth device, wherein the first device is configured to operate at a voltage higher than the second device, and wherein the third device is configured to operate at a voltage lower than the second device, wherein the fourth device is configured to operate a voltage lower than the third device, and wherein the fifth device is configured to operate a voltage lower than the third device; and
   metallization layers above and coupled to the first device.

14. A device, comprising:
   a P-well channel in a semiconductive substrate;
   a high-K metal gate disposed above the P-well channel, wherein the high-K metal gate includes a first side and a second side;
   an N+ source implant on the first side and an N+ drain implant on the second side, and wherein the N+ source implant includes an implant finger at the first side;
   a N drain well in the semiconductive substrate that forms a junction with the P-well channel;
   a salicide source contact pad in the semiconductive substrate;
   a salicide drain contact pad in the drain well, wherein the salicide drain contact pad is located farther from the second side than the source contact pad is located from the first side; and
   an interlayer dielectric layer (ILD0) disposed above and on the salicide source and drain contact pads, upon the drain well, and upon the high-K metal gate.

15. The device of claim 14, wherein resistance between the drain implant the channel is greater than resistance between the source implant and the channel.

16. The device of claim 14, wherein the high-K metal gate has a first lateral dimension between the first side and the second side, wherein the N drain well has a second lateral dimension, and wherein the second lateral dimension is equal to or greater than the first lateral dimension.

17. The device of claim 14, wherein resistance between the drain implant the channel is greater than resistance between the source implant and the channel, and wherein the high-K metal gate has a first lateral dimension between the first side and the second side, wherein the N drain well has a second lateral dimension, and wherein the second lateral dimension is equal to or greater than the first lateral dimension.

18. The device of claim 14, further including:
a source contact that penetrates the ILD0 and that contacts the salicide source contact pad; and
a drain contact that penetrates the ILD0 and that contacts the salicide drain contact pad.

19. The device of claim 14, wherein resistance between the drain implant and the channel is greater than resistance between the source implant and the channel, and wherein the high-K metal gate has a first lateral dimension between the first side and the second side, wherein the N drain well has a second lateral dimension, and wherein the second lateral dimension is equal to or greater than the first lateral dimension, the apparatus further including:
a source contact that penetrates the ILD0 and that contacts the salicide source contact pad; and
a drain contact that penetrates the ILD0 and that contacts the salicide drain contact pad.

20. A computing system, comprising:
an apparatus including:
a channel in a semiconductive substrate;
a gate disposed above the channel;
a source implant on a first side of the gate and a drain implant on a second side of the gate;
a drain well in the semiconductive substrate that forms a junction with the channel;
a salicide source contact pad in the semiconductive substrate;
a salicide drain contact pad in the drain well, wherein the salicide drain contact pad is located farther from the second side than the salicide source contact pad is located from the first side; and
an interlayer dielectric layer (ILD0) disposed above and on the salicide drain contact pad and the drain well to complete a first device;
a second device disposed in a region of the semiconductive substrate that is separate from the first device and
a foundation substrate coupled to the first device and the second device.

21. The computing system of claim 20, wherein the foundation substrate is a BBUL structure that incorporates the apparatus as system-on-chip (SoC) apparatus with an RF-capable region and a subsequent region that operates at a voltage lower than the RF-capable region.

22. The computing system of claim 20, wherein the computing system is part of one of a cellular telephone, a pager, a portable computer, a desktop computer, and a two-way radio.

23. An apparatus comprising:
a first device comprising:
a channel in a semiconductive substrate;
a gate electrode disposed above the channel;
a source implant on a first side of the gate electrode and a drain implant on a second side of the gate electrode;
a drain well in the semiconductive substrate that forms a junction with the channel;
a salicide source contact pad on the semiconductive substrate;
a salicide drain contact pad on the drain well, wherein the salicide drain contact pad is located farther from the second side than the source contact pad is located from the first side; and
an interlayer dielectric layer (ILD0) disposed above and on the salicide drain contact pad and the drain well,
wherein the first device is included in a first region of the semiconductive substrate; and
a second device included in a second region of the semiconductive substrate separate from the first device;
wherein the first device is configured to operate at a voltage higher than the second device.

24. The apparatus of claim 23, wherein the gate electrode is a high-K metal gate electrode, the first device includes an oxide dielectric disposed on the channel, and a high-K dielectric is disposed between the oxide dielectric and the gate electrode.

25. The apparatus of claim 23, the first device including a source contact that penetrates the ILD0, wherein the source contact is symmetrical to the source contact pad.

26. The apparatus of claim 23, the first device including:
a source contact that penetrates the ILD0 and contacts the salicide source contact pad; and
a drain contact that penetrates the ILD0 and contacts the salicide drain contact pad;
wherein the ILD0 is disposed above and on the salicide source contact pad.

27. The apparatus of claim 23, wherein the gate electrode is part of a gate, the first device including:
a source contact that penetrates the ILD0 and contacts the salicide source contact pad; and
a drain contact that penetrates the ILD0 and contacts the salicide drain contact pad;
wherein the ILD0 is disposed above and on the gate.

28. A device, comprising:
a channel in a semiconductive substrate;
a gate electrode disposed above the channel;
a source implant on a first side of the gate electrode and a drain implant on a second side of the gate electrode;
a drain well in the semiconductive substrate that forms a junction with the channel;
a salicide source contact pad on the semiconductive substrate;
a salicide drain contact pad on the drain well, wherein the salicide drain contact pad is located farther from the second side than the source contact pad is located from the first side; and
an interlayer dielectric layer (ILD0) disposed above and on the salicide drain contact pad and the drain well;
a source contact that penetrates the ILD0 and that contacts the salicide source contact pad; and
a drain contact that penetrates the ILD0 and that contacts the salicide drain contact pad;
wherein the ILD0 is disposed above and on the salicide source contact pad.

29. The device of claim 28, wherein the source contact is symmetrical to the source contact pad.

30. The device of claim 28, wherein the device is a first device in a first region of the semiconductive substrate, a subsequent device is included in a region separate from the first device, the first device is configured to operate at a voltage higher than the subsequent device, and the first device and the subsequent device form an apparatus.

31. The device of claim 28, wherein the gate electrode has a first lateral dimension between the first side and the second side, and the drain well has a second lateral dimension that is equal to or greater than the first lateral dimension.

* * * * *